(12) United States Patent
Qian et al.

(10) Patent No.: US 10,950,550 B2
(45) Date of Patent: Mar. 16, 2021

(54) SEMICONDUCTOR PACKAGE WITH THROUGH BRIDGE DIE CONNECTIONS

(71) Applicant: Intel Corporation, Santa Clara, CA (US)

(72) Inventors: Zhiguo Qian, Chandler, AZ (US); Jianyong Xie, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 15/774,306

(22) PCT Filed: Dec. 22, 2015

(86) PCT No.: PCT/US2015/067447
§ 371 (c)(1),
(2) Date: May 8, 2018

(87) PCT Pub. No.: WO2017/111957
PCT Pub. Date: Jun. 29, 2017

(65) Prior Publication Data
US 2020/0243448 A1    Jul. 30, 2020

(51) Int. Cl.
*H01L 23/12* (2006.01)
*H01L 23/14* (2006.01)
(Continued)

(52) U.S. Cl.
CPC ...... *H01L 23/5381* (2013.01); *H01L 21/4853* (2013.01); *H01L 21/4857* (2013.01);
(Continued)

(58) Field of Classification Search
CPC ............... H01L 23/481; H01L 23/5381; H01L 21/4853; H01L 21/4857; H01L 21/4864;
(Continued)

(56) References Cited

U.S. PATENT DOCUMENTS 7,727,802 B2 *   6/2010   Sunohara ............... H05K 1/185
                                                        438/107
10,163,798 B1 * 12/2018   Alur ........................ H01L 24/16
(Continued)

FOREIGN PATENT DOCUMENTS

DE       102014107514    3/2015
WO       WO-2015-130264  9/2015

OTHER PUBLICATIONS

International Search Report and Written Opinion for International Application No. PCT/US2015/067447 dated Aug. 31, 2016, 12 pgs.
(Continued)

*Primary Examiner* — Alonzo Chambliss
(74) *Attorney, Agent, or Firm* — Schwabe, Williamson & Wyatt, P.C.

(57) ABSTRACT

Semiconductor packages with through bridge die connections and a method of manufacture therefor is disclosed. The semiconductor packages may house one or more electronic components as a system in a package (SiP) implementation. A bridge die, such as an embedded multi-die interconnect bridge (EMIB), may be embedded within one or more build-up layers of the semiconductor package. The bridge die may have an electrically conductive bulk that may be electrically connected on a backside to a power plane and used to deliver power to one or more dies attached to the semiconductor package via interconnects formed on a topside of the bridge die that are electrically connected to the bulk of the bridge die. A more direct path for power delivery through the bridge die may be achieved compared to routing power around the bridge die.

22 Claims, 8 Drawing Sheets

(51) Int. Cl.
   *H01L 23/48*      (2006.01)
   *H01L 21/4763*    (2006.01)
   *H01L 23/538*     (2006.01)
   *H01L 21/48*      (2006.01)
   *H01L 23/498*     (2006.01)
   *H01L 23/00*      (2006.01)
   *H01L 25/065*     (2006.01)

(52) U.S. Cl.
   CPC .... *H01L 21/4864* (2013.01); *H01L 23/49816* (2013.01); *H01L 23/5386* (2013.01); *H01L 23/5389* (2013.01); *H01L 24/19* (2013.01); *H01L 24/24* (2013.01); *H01L 24/82* (2013.01); *H01L 24/97* (2013.01); *H01L 25/0655* (2013.01); *H01L 24/16* (2013.01); *H01L 2224/16235* (2013.01); *H01L 2224/24137* (2013.01)

(58) Field of Classification Search
   CPC ........... H01L 23/49816; H01L 23/5386; H01L 23/5389; H01L 24/19; H01L 24/24; H01L 24/82; H01L 24/97; H01L 25/0655; H01L 25/0657
   See application file for complete search history.

(56) References Cited

U.S. PATENT DOCUMENTS

| | | | | |
|---|---|---|---|---|
| 10,297,582 | B2* | 5/2019 | Caskey | ............... H05K 1/0298 |
| 2006/0145328 | A1* | 7/2006 | Hsu | .................. H05K 1/185 |
| | | | | 257/690 |
| 2008/0246126 | A1* | 10/2008 | Bowles | .................. H01L 24/82 |
| | | | | 257/659 |
| 2009/0115047 | A1* | 5/2009 | Haba | .................... H01L 21/486 |
| | | | | 257/690 |
| 2014/0299999 | A1 | 10/2014 | Hu et al. | |
| 2014/0332966 | A1 | 11/2014 | Xiu et al. | |
| 2014/0360767 | A1* | 12/2014 | Terui | .................. H01L 23/5384 |
| | | | | 174/261 |
| 2015/0001717 | A1 | 1/2015 | Karhade et al. | |
| 2015/0001731 | A1* | 1/2015 | Shuto | ..................... H01L 25/18 |
| | | | | 257/774 |
| 2015/0282328 | A1* | 10/2015 | Hamada | ............... H05K 1/0242 |
| | | | | 361/764 |
| 2015/0364422 | A1 | 12/2015 | Zhai et al. | |
| 2016/0104668 | A1* | 4/2016 | Lii | ..................... H01L 25/0657 |
| | | | | 257/774 |
| 2016/0379959 | A1* | 12/2016 | We | ........................ H01L 25/105 |
| | | | | 257/773 |

OTHER PUBLICATIONS

International Preliminary Report on Patentability for International Application No. PCT/US2015/067447 dated Jul. 5, 2018, 9 pgs.

Office action (8 pgs no translation) and Search Report (2 pgs w English translation) for Taiwan Patent Application No. 105138250 dated Feb. 10, 2020.

Office action from Taiwan Patent Application No. 105138250 dated Jul. 27, 2020, 10 pages.

Office action from German Patent Application No. 112015007213.6 dated Jun. 25, 2020, 7 pages.

* cited by examiner

SEMICONDUCTOR PACKAGE WITH THROUGH BRIDGE DIE CONNECTIONS

CROSS-REFERENCE TO RELATED APPLICATION(S)

This application is a U.S. National Stage Application under 35 U.S.C. 371 and claims the priority benefit of International Application No. PCT/US15/67447, filed Dec. 22, 2015, which is incorporated herein by reference as if set forth in full.

TECHNICAL FIELD

This disclosure generally relates to semiconductor packages with bridge die, and more particularly to electrical connections through bridge die.

BACKGROUND

Integrated circuit(s) and other electronic devices may be packaged on a semiconductor package. The semiconductor package may be integrated onto an electronic system, such as a consumer electronic system. The integrated circuit(s) and/or electronic devices provided on the semiconductor package may have relatively fine pitch input/output needs as well as relatively stringent power delivery or ground plane requirements.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1A:
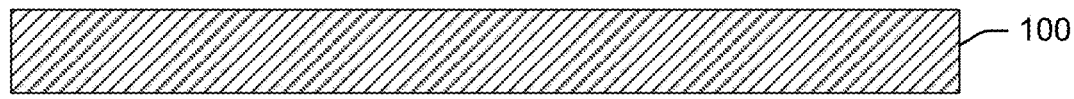
FIGS. 1A-1G depict simplified cross-sectional schematic diagrams of an example semiconductor package with through bridge die connections and a fabrication process therefor, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In example embodiments, semiconductor package structures may include a package substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. The build-up layers, as built up on the core, may have interconnects formed therein. The interconnects may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. Furthermore, the core of the semiconductor package may have a plurality of through vias to make electrical connections from one side of the core to the other side of the core. Thus, through vias in the core may allow electrical connections between one or more build-up layers on the top of the semiconductor package to one or more build-up layers on the bottom of the semiconductor package.

One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the build-up layers on the bottom of the core may have one or more input/output (I/O) connections between the semiconductor package and a board. Semiconductor package-to-board level interconnects may be provided on one or both sides of the package substrate. In example embodiments, the semiconductor package-to-board level interconnects may be ball grid array (BGA) connections, other area connections, periphery connections, or the like.

Embodiments of the disclosure may provide a semiconductor package and a method for fabrication of the semiconductor package. In example embodiments, the semiconductor package may have one or more bridge dies, such as one or more embedded dies within an embedded multi-die interconnect bridge (EMIB)-based semiconductor package, as described herein. These semiconductor packages with the embedded bridge die may be fabricated using the methods as disclosed herein. The bridge die may be provided within the package substrate, such as in a cavity formed within build-up layers of the package substrate, to enable relatively finer (e.g., high density) interconnections between electrical components (e.g., integrated circuits) provided on the semiconductor package. The bridge die may provide a relatively more rigid substrate than the semiconductor package substrate embedded within a portion of the semiconductor package substrate. As a result of the relatively greater rigidity of the embedded bridge die, it may be possible to make finer pitch interconnections between dies disposed on the surface of the semiconductor package.

In some cases, the embedded bridge die may be fabricated in a semiconductor fabrication facility (e.g., fab), while the semiconductor package substrate may be fabricated in a semiconductor packaging facility. Typically, a fab may have equipment and facilities to fabricate smaller dimension features on the bridge die than what could be fabricated in a packaging facility. Alternatively, silicon fabrication-type equipment may be provided in a packaging facility to fabricate the bridge die with relatively fine pitch structures.

In example embodiments, dies that are attached to the semiconductor package substrate may have portions overlying the bridge die and other portions that do not overlie the bridge die. In some example embodiments, the dies (e.g., integrated circuits) that are packaged in the semiconductor package, as described herein, may have input/output (I/O) connections for various sizes. For example, a particular die may have finer pitch I/O connections with another die packaged on the semiconductor package via the bridge die and may have other I/O connections that are looser pitch connections where the signals do not propagate through the bridge die.

The semiconductor package may have a power layer (e.g., a metal interconnect layer of the semiconductor package at a supply voltage of one or more integrated circuits or other components of the semiconductor package) provided within the semiconductor package. Additionally, the semiconductor package may have a ground plane formed in a layer that is within the package substrate, such as on the package core and/or a build-up layer. According to example embodiments, the bridge die may be configured such that a power and/or ground connection may be provided through the bridge die, such as through the bulk of the bridge die.

According to example embodiments, of the disclosure, the bulk portions of the bridge die may be doped at a relatively high doping level (e.g., $N_A$ or $N_D \sim 10^{19}$-$10^{20}$ cm$^{-3}$, etc.) to provide a relatively low bulk resistivity (5 mΩ·cm, etc.) of the silicon bulk of the bridge die. As a result, not only may back-end-of-line (BEOL) interconnect layers on the bridge die be used for the purposes of providing signaling pathways via the bridge die, but the bulk of the bridge die may also be used for providing power. In example embodiments, the bridge die with through connections may be disposed in a cavity formed in the build-up layers of the semiconductor package. In example embodiments, the bulk of the bridge die may be electrically connected to one of a power or ground. The bridge die may further have one or more build-up layers disposed thereon. In other words, the bridge die may have a build-up layer under it and over it. The bridge die, in these example embodiments, may provide a vertical path for power or ground from the underlying build-up layer to the overlying build-up layer. It will be appreciated that without conduction through the bridge die, the power or ground would be routed in the package substrate around the bridge die. Such a routing may be less direct, through various interconnects (e.g., vias and/or traces), resulting in a more resistive and/or inductive pathway to certain end nodes (e.g., I/Os of packaged ICs) relative to routing through the bridge die, as disclosed herein.

In example embodiments, the bulk of the bridge die may have impurities (e.g., acceptor or donor atoms) to provide a relatively low resistivity pathway for conducting power or ground. The bridge die may further include an ohmic contact on the backside of the bridge die. This may, in example embodiments, be a metallic (e.g., a refractory metal, etc.) contact to the back side of the bridge die. In some example embodiments, the metallic backside contact may be to degenerately doped silicon on the backside surface (e.g., bottom surface of the bridge die). The bridge die may further have one or more levels of interconnect (e.g., metal layers) formed thereon. Metal traces in the level(s) of interconnect may provide pathways for signals and/or for providing a contact to the bulk of the bridge die. Contacts (e.g., vias and/or contacts to the bulk of the bridge die) may provide a pathway for conduction of power or ground through the bulk of the bridge die. Thus, the metal traces of the interconnect layers on the bridge die may be used for both conduction through the bulk silicon of the bridge die, as well as for signaling and I/O of the integrated circuits disposed in the semiconductor package with through bridge die connections, in accordance with example embodiments of the disclosure.

In example embodiments, power may be distributed to dies packaged on the semiconductor package with through bridge die connections. In this case, the bulk of the bridge dies may be electrically connected to a power plane of the semiconductor package and may provide a vertical route for power through the bridge die to the top of the bridge die. In example embodiments, the bridge die may have a backside ohmic contact with the power plane. The power plane may have one or more contacts with the backside of the bridge die using conductive paste or other adhesive provided between the bridge die and the build-up layer of the power plane. The bridge die may be disposed in a cavity formed within the semiconductor substrate, such as by the removal of portions of one or more build-up layers. The bulk of the bridge die may be at the voltage of the power supply and the current flowing through the bridge die may depend on the power draw, as well as the other connections to power of the integrated circuits packaged in the semiconductor package with through bridge die connections. It will be appreciated that by providing power through the bridge die, rather than having to route power pathways around the bridge die, a more direct (e.g., relatively more vertical) pathway of power may be provided to the I/Os of the integrated circuits packaged in the semiconductor package. In example embodiments, providing the power in a more direct pathway, as disclosed herein, may result in a generally higher quality of power delivery, such as with reduced ohmic and dynamic drop from the source power voltage, or with reduced variation in power delivery across different dies and/or different parts of a die packaged in the semiconductor package.

In example embodiments, ground connections may be provided to dies packaged on the semiconductor package with through bridge die connections. In this case, the bulk of the bridge dies may be electrically connected to a ground plane of the semiconductor package and may provide a vertical route for ground through the bridge die to the top of the bridge die. In example embodiments, the bridge die may have a backside ohmic contact with the ground plane. The ground plane may have one or more contacts with the backside of the bridge die using conductive paste or other adhesive provided between the bridge die and the build-up layer of the ground plane. The bridge die may be disposed in a cavity formed within the semiconductor substrate, such as by the removal of portions of one or more build-up layers. The bulk of the bridge dies may be at the reference/ground voltage (e.g., 0 volts), and the return current flowing through the bridge die from the packaged integrated circuits may depend on the power draw and on the other connections to ground of the integrated circuits packaged in the semiconductor package with through bridge die connections. It will be appreciated that by providing ground connections through the bridge die, rather than having to route ground pathways around the bridge die, a more direct (e.g., relatively more vertical) pathway of ground may be provided to the I/Os of the integrated circuits packaged in the semiconductor package. In example embodiments, providing ground connections in a more direct pathway, as disclosed herein, may result in a generally higher quality of ground connection, such as with reduced ohmic drop and relatively closer alignment with reference voltage, or with reduced ground voltage variation across different dies and/or different parts of a die packaged in the semiconductor package.

FIGS. 1A-1G depict simplified cross-sectional schematic diagrams of an example semiconductor package with through bridge die connections and a fabrication process therefor, in accordance with example embodiments of the disclosure. Although FIGS. 1A-1G depict a particular process flow and resulting semiconductor package with through bridge die connections, it will be appreciated that variations of the processes and structures are contemplated and encompassed by the disclosure as provided herein. For example, it will be appreciated that some processes may be performed in an order different from that depicted herein. As a further example, it will be appreciated that some processes may have suitable substitutes that may be implemented without deviating from embodiments of the disclosure.

The processes, as depicted herein, may be implemented to concurrently or nearly concurrently fabricate a plurality of semiconductor packages with through bridge die connections. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the semiconductor package, in accordance with example embodiments of the disclosure. Although the cross-sections as depicted here show a particular number of semiconductor package(s) (e.g., a single semiconductor package) fabricated concurrently on a package substrate panel, it will be appreciated that there may be any number of semiconductor packages that are fabricated concurrently or nearly concurrently on a particular package substrate panel. Additionally, although an example embodiment of the sequence of processes for fabricating a semiconductor package with through bridge die connections is depicted on a single package substrate panel, it will be appreciated that there may be any number of package substrate panels that may be processed concurrently and/or nearly concurrently through any of the processes depicted herein. For example, some processes may be batch processes where a particular unit may be processed along with another of that unit. In other cases, unit processes may be performed in a sequential manner on work-in-progress (WIP).

FIG. 1A depicts a simplified cross-sectional schematic diagram of an example semiconductor package core 100 on which build-up layers may be fabricated, in accordance with example embodiments of the disclosure. At this point, the package core 100 may be of a size greater than the size of the package substrate. In other words, the package substrate and the core may be singulated into separate semiconductor packages after completing other fabrication processes in a batch fashion with other package substrates on the same panel. The package core 100 may be of any suitable size and/or shape. For example, the package core 100, in example embodiments, may be a rectangular panel. In example embodiments, the package core 100 may be fabricated of any suitable material, including polymer material, ceramic material, plastics, composite materials, glass, epoxy laminates of fiberglass sheets, FR-4 materials, FR-5 materials, combinations thereof, or the like. Although not depicted here, it will be appreciated that the package core 100 may have through vias formed therein. Through vias may be used for propagating electrical signals from the top of the package core 100 to the bottom of the package core 100, and vice versa.

Figure 1B:
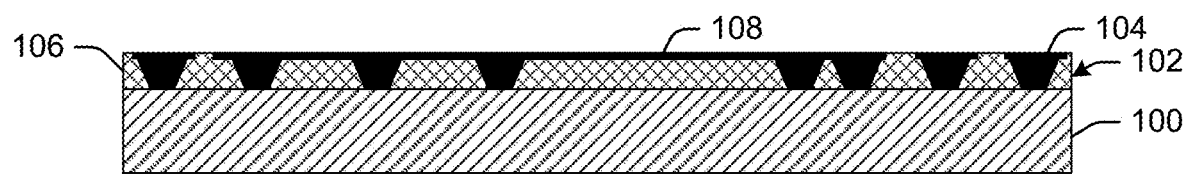

FIG. 1B depicts a simplified cross-sectional schematic diagram of a build-up layer 102 fabricated on the package core 100 of FIG. 1A with a power plane contact 108, in accordance with example embodiments of the disclosure. The build-up layer 102 may have dielectric materials 106 and electrical connections 104, 108 (e.g., vias, pads, traces, etc.) thereon. The power plane contact 108 may have a relatively large contact area, in example embodiments, compared to other electrical connections 104. In some example embodiments, the power plane contact 108 may be fabricated to have as large of a surface area as may be permitted by suitable packaging design rules. In some example embodiments, the power plane contact 108 may be slotted or may have various other patterns of formation to avoid having a relatively large contiguous area of metal within the dielectric material 106. By breaking up the area of the power plane contact 108, in example embodiments, a relatively more robust design may be realized, with a relatively greater tolerance for temperature cycling, relatively reduced rates of failure, etc.

The build-up layer 102 or interconnect layer may be formed by a variety of suitable processes. Dielectric material 106 may be laminated on the semiconductor package core 100. In example embodiments, the dielectric laminate may be any suitable material, including polymer material, ceramic material, plastics, composite materials, liquid crystal polymer (LCP), epoxy laminates of fiberglass sheets, FR-4 materials, FR-5 materials, combinations thereof, or the like. In some example embodiments, the package core 100 and the build-up dielectric material 106 may be the same type of material. In other example embodiments, the package core 100 and the build-up dielectric material 106 may not be constructed of the same material type. Vias and/or trenches may be patterned in the build-up layer 102 using any suitable mechanism, including photolithography, plasma etch, laser ablation, wet etch, combinations thereof, or the like. The vias and trenches may be defined by vertical and horizontal metal traces, respectively, within the build-up layer 102. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

Figure 1C:
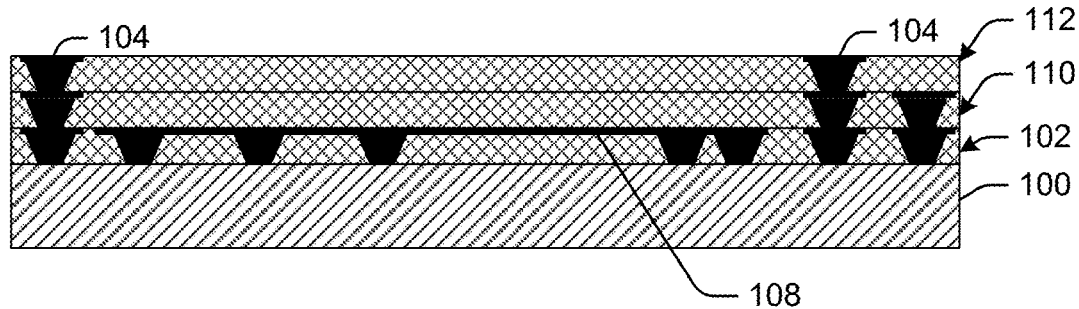

FIG. 1C depicts a simplified cross-sectional schematic diagram showing a plurality of build-up layers 102, 110, 112 fabricated on the package core 100 of FIG. 1A, in accordance with example embodiments of the disclosure. In example embodiments, subsequent build-up layers 110, 112 may be fabricated in a similar manner as the fabrication of the first build-up layer 102. It will also be appreciated that although the build-up layers 102, 110, 112 are depicted on the top side of the package core 100, in example embodiments of the disclosure, the build-up layers may be fabricated on the bottom side of the package core 100 and/or on both sides of the package core 100. In fact, in some example embodiments, the build-up layers may be fabricated on both sides of the core concurrently or nearly concurrently. For example, in these example embodiments, the dielectric material 106 and/or the metal may be laminated to both sides of the package core 100. Furthermore, in these example embodiments, other processes, such as plating and/or clean processes, may be performed for a build-up layer fabricated on both sides of the package core 100.

As discussed above, the build-up layers 110, 112, as depicted in FIG. 1C, may be fabricated with any suitable material including, but not limited to, polymer material, ceramic material, plastics, composite materials, LCP, epoxy laminates of fiberglass sheets, FR-4 materials, FR-5 materials, combinations thereof, or the like. Again, in some example embodiments, the package core 100 and all of the build-up dielectric material 106 may be the same type of material. In other example embodiments, the package core 100 and at least one or more of the build-up dielectric material 106 may not be constructed of the same material type. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively, within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

In example embodiments, the portions of build-up layers 110, 112 overlying the power plane contact 108 of the build-up layer 102 may not have metal traces and/or metal pads. In fact, in example embodiments, design rules may prevent providing metal traces embedded within the build-up dielectric material 106 in portions of the build-up layers 110, 112 that overlie the power plane contact 108. Such an exclusion zone may, in example embodiments, be larger than the actual size of the power plane contact 108 to allow for bridge die placement inaccuracies and/or cavity formation inaccuracies in subsequent processes.

Figure 1D:
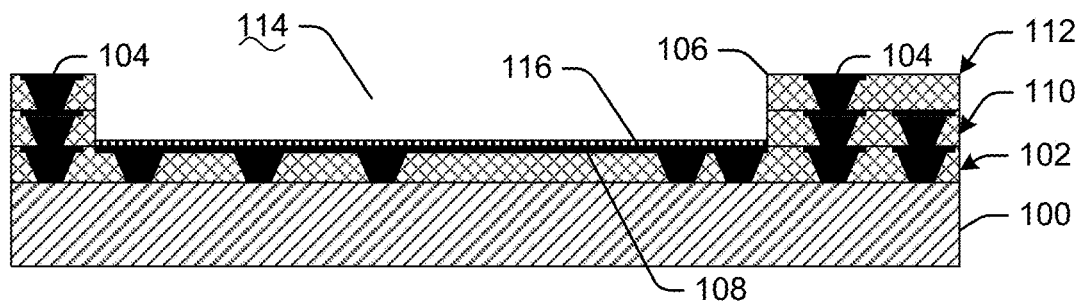

FIG. 1D depicts a simplified cross-sectional schematic diagram of a cavity 114 formed in the build-up layers 110, 112 depicted in FIG. 1C with conductive adhesive 116 disposed on top of the power plane contact 108, in accordance with example embodiments of the disclosure. The cavity 114 may be formed by any suitable mechanism including, for example, laser ablation, dry etch, wet etch, combinations thereof, or the like. It will be appreciated that for processes such as wet etching and/or dry etching, a patterning (e.g., photolithographic) process may be performed to define the regions where the build-up dielectric material 106 is to be removed. It will also be appreciated that the formation of the cavity 114 may be performed with multiple processes. For example, a laser ablation process may be followed with an unmasked wet etch/clean process. In example embodiments, the dimensions of the cavity 114 may be relatively larger than the corresponding dimensions of the bridge die that is to be seated within the cavity 114. The difference in dimensions between the cavity 114 and the corresponding dimensions of the bridge die may depend, at least in part, on the alignment and/or placement accuracy of pick-and-place tools or other mechanisms by which the bridge die is to be placed within the cavity 114.

Conductive adhesive 116, such as conductive ink and/or conductive paste, may be dispensed on the surface of the power plane contact 108. The conductive adhesive 116 may be disposed on the power plane contact 108 surface by spin deposition, spray deposition, screen printing, squeegee process, and/or any other suitable deposition process. In example embodiments, the conductive adhesive 116 may wet the metal of the power plane contact 108 and, therefore, may spread over the surface of the power plane contact 108 driven by Van der Waals forces and/or surface wetting action. In the same or other example embodiments, the conductive adhesive 116 may be forced into the cavity 114 by mechanical force, such as by a squeegee process. In yet other example embodiments, the conductive adhesive 116 may be preferentially deposited using a screen printing process, such as by aligning a patterned screen on the top of the surface of the power plane contact 108 and the conductive adhesive 116. In some example embodiments, the amount of conductive adhesive 116 deposited in the cavity 114 may be a predetermined amount. In some cases, the predetermined amount may be approximately the expected difference between the volume of the cavity 114 and the volume of the bridge die that is to be embedded within the cavity 114 in subsequent processes. In this case, the conductive adhesive 116 may wick up between the sidewalls of the embedded bridge die and the sidewalls of the cavity 114. In this way, a relatively planar surface may be achieved after embedding the bridge die, by filling the gap that may be designed to accommodate misalignment errors in embedding the bridge die in subsequent processes.

The conductive adhesive 116 may be an epoxy material with metal nanoparticles or microparticles suspended therein. In example embodiments, the conductive adhesive 116 may have silver (Ag) nanoparticles suspended therein. In other example embodiments, the conductive ink may have nanoparticles of copper (Cu), tin (Sn), iron (Fe), gold (Au), combinations thereof, or the like, suspended therein. In some embodiments, the conductive adhesive 116 may have suspended therein non-metallic electrically conductive particles. In addition to having conductive materials in the conductive adhesive 116, there may further be other chemical agents to tune the physical, electrical, and/or processing properties of the conductive adhesive 116. In example embodiments, the conductive adhesive 116 may have solvents that may allow the conductive adhesive 116 to have a viscosity that may be relatively preferential for gap filling, while providing a relatively quick increase in viscosity and/or tackiness for staging in the cavity 114. In same or other example embodiments, the conductive adhesive 116 may have reducing agents to prevent or reduce the oxidation of metal particles that may be suspended in the conductive ink. Further still, the conductive adhesive 116 may contain filler particles (e.g., carbon fibers, silica particles, ceramics, etc.) in proportions that provide the conductive adhesive 116 with desirable properties, such as a preferred range of viscosity, a preferred range of tackiness, a preferred range of hydrophobicity (e.g., surface wetting), a preferred range of particle suspension properties, a preferred range of cure temperatures, combinations thereof, or the like. In example embodiments, the conductive adhesive 116 may be a stage-B epoxy, where the conductive adhesive 116 may be staged on top of the power plane contact 108 and then may be cured (e.g., cross-linked, hardened, etc.) after embedding the bridge die. In example embodiments, the conductive adhesive 116 may be cured during subsequent processing, such as while laminating subsequent layer(s) of build-up dielectric material 106 on top of the bridge die.

Figure 1E:
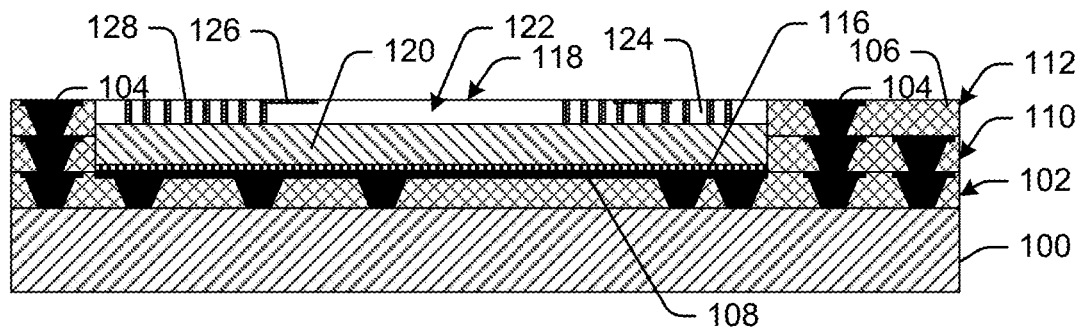

FIG. 1E depicts a simplified cross-sectional schematic diagram of the example semiconductor package with the bridge die 118 embedded within the cavity 114 of FIG. 1D, in accordance with example embodiments of the disclosure. Although the bridge die 118 is shown to fit snugly in the cavity 114, it will be appreciated that there may be some gap between the edges of the bridge die 118 and the sidewalls of the cavity 114. In example embodiments, such a gap may be filled, at least in part, with an epoxy, such as the conductive adhesive 116 or other non-conductive materials. The backside of the bridge die 118 may sit on and make electrical contact with the conductive adhesive 116, and thus be electrically coupled to the power plane contact 108. The bridge die 118 may include a bulk portion 120 and one or more metal interconnect layers 122 fabricated on top of the bulk portion 120. The bulk portion 120 may make electrical contact with the power plane contact 108 via the conductive adhesive 116. The metal interconnect layer(s) 122 may have dielectric materials 124 with metal vias/contacts 128 and metal lines 126. In some example embodiments, one or more of the vias/contacts 128 may make contact to the bulk portion 120 of the bridge die 118 to route power from the power plane contact 108 via the conductive adhesive 116 and the bulk portion 120 and to one or more metal lines 126 or pads. These powered metal lines 126 may be electrically connected, such as via another build-up layer overlying the bridge die to one or more dies to be packaged in the semiconductor package with through bridge die contacts. The metal lines 126, such as metal traces and/or contact pads, may be used for the purposes of routing the signaling I/O between the dies assembled on the semiconductor package with through bridge die contacts.

Figure 1F:
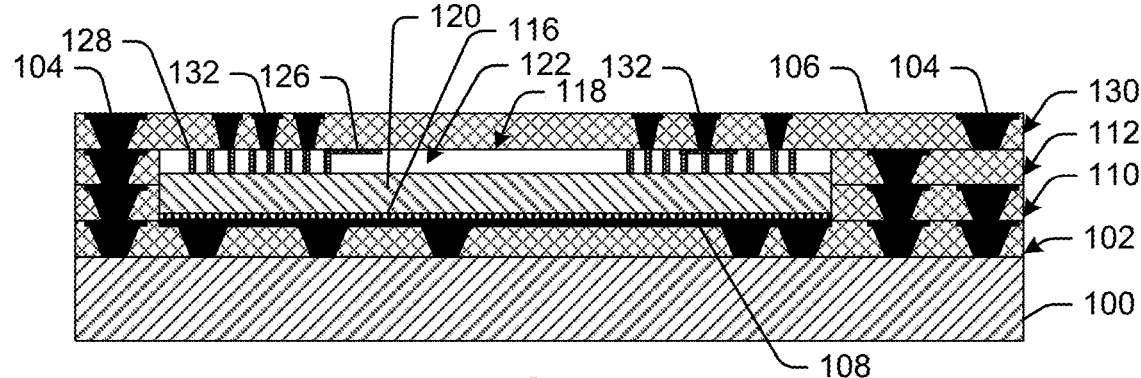

FIG. 1F depicts a simplified cross-sectional schematic diagram of the bridge die 118 embedded semiconductor package with a build-up layer 130 on top and encapsulating the bridge die 118, in accordance with example embodiments of the disclosure. The build-up layer 130 may be fabricated in a manner similar to that of build-up layers 102, 110, 112. Build-up layer 130, like the other build-up layers 102, 110, 112, may have dielectric material 106 separating metal lines and/or pads 104, 132. In example embodiments, the metal lines 104, 132 on which die I/Os may be connected may be of a different size. For example, there may be smaller dimension contacts 132 and larger dimension contacts 104, as shown. In example embodiments, the smaller dimension contacts 132 may be made to metal lines 126 of the bridge die 118 and larger dimension contacts 104 may be fabricated for contacts made to underlying build-up layer contacts. In some example embodiments, the smaller dimension contacts may further be connected to relatively fine dimension I/O contacts of one or more dies. In these example embodiments, the rigidity provided to the packaging in select regions (e.g., regions overlying or in relative proximity to the bridge die 118) may enable the use of relatively smaller dimension I/O contacts of packaged dies, smaller dimension pads 132 at the top layer of package build-up layers 130, and/or higher density routing via the bridge die 118.

Figure 1G:
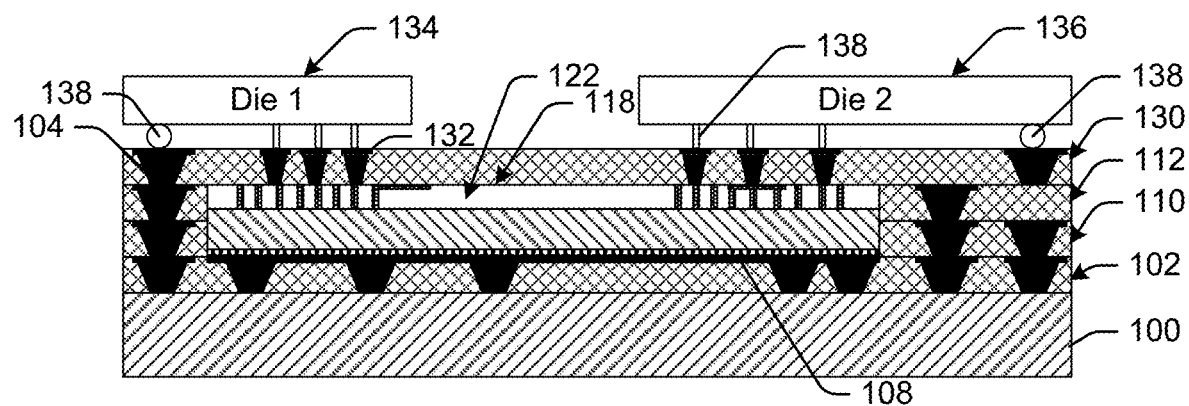

FIG. 1G depicts a simplified cross-sectional schematic diagram of the bridge die 118 embedded semiconductor package of FIG. 1F with two dies 134, 136 attached thereon, in accordance with example embodiments of the disclosure. The dies 134, 136 may be attached by any suitable mechanism. The dies 134, 136 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. The dies 134, 136 may be electrically and mechanically coupled to the package core 100 via any suitable contact 138, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the type of contact 138 may be different for the different dies 134, 136. For example, one die 134, 136 may have copper pillar contacts 138 and the other die 134, 136 may have solder bump contacts 138. In other example embodiments, the different dies 134, 136 may have the same type of contacts 138 (e.g., both dies 134, 136 have copper pillar contacts 138) but may have different dimensions of those contacts 138. In other words, one die 134, 136 may have a smaller or larger contact size than the other die 134, 136, and the top build-up layer 130 may be configured to accommodate the difference in sizes. Further still, in example embodiments, each of the dies 134, 136 may have different types and/or different sizes of contacts 138 to the top build-up layer 130 and the contacts 132, 104 thereon. For example, the die level contacts 138 may be relatively smaller dimensions when contacting package level contacts 132, rather than package level contacts 104. Indeed, in example embodiments, the use of the bridge die 118 and the rigidity provided thereby may enable the use of finer die level contacts 138 and/or package level contacts 132 to enable higher density I/O and or signaling.

Although the sequence of processes depicted in FIGS. 1A-1G illustrate a package (e.g., System in a Package (SiP)) having two dies 134, 136, it will be appreciated that there may be any suitable number of dies in the SiP structure. It will further be appreciated that the the die may be any suitable type of die (e.g., electronic components). In a non-limiting example, there may be a microprocessor die, a non-volatile memory die, a volatile memory die, and a graphics controller die on a single SiP as a semiconductor package with through bridge die connections. The various dies on this SiP may have power delivered through contacts that are made to a power plane contact via a bridge die. Additionally, contacts between the dies (e.g., microprocessor to non-volatile memory contacts, processor to volatile memory contact, graphics controller to non-volatile memory, etc.), may also be made via interconnects provided on the bridge die. In another non-limiting example, an SiP with bridge dies may have a digital signal processor (DSP) die, a baseband die, a memory die, and a power amplifier die. Again, in this example, one or more of the dies may be at least partially powered via through bridge die contacts to a powered contact of the SiP. Additionally, one or more of the dies may be communicatively connected to each other at least partially via interconnect structures fabricated on top of the bridge die.

Figure 2:
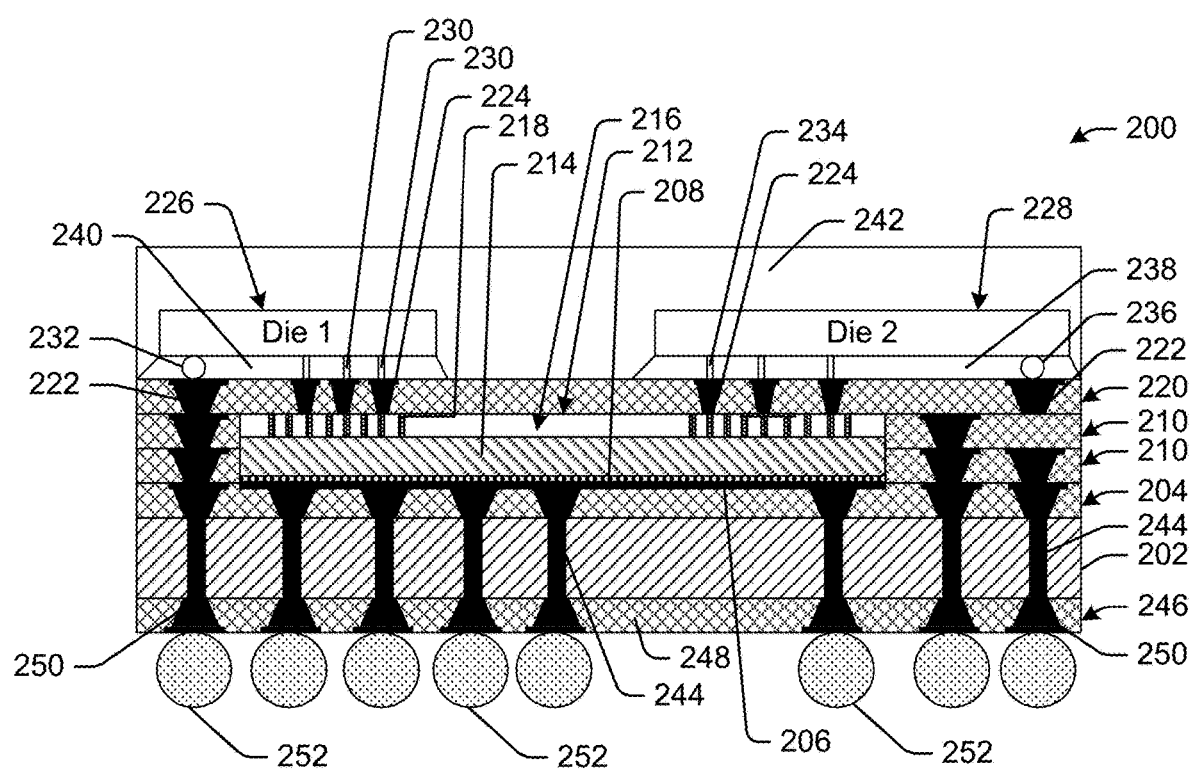
FIG. 2 depicts a simplified cross-sectional schematic diagram illustrating a semiconductor package with multiple dies provided therein with through bridge die connections, in accordance with example embodiments of the disclosure.

FIG. 2 depicts a simplified cross-sectional schematic diagram illustrating a semiconductor package 200 with multiple dies 226, 228 provided therein with through bridge die connections, in accordance with example embodiments of the disclosure. As discussed above, there may be a core 202 with at least one build-up layer 204 provided over the core 202 and having a power plane contact 206 therein. Although a single build-up layer 204 between the core 202 and the bridge die 212 is shown here, it will be appreciated that there may be any suitable number of build-up layers between the core 202 and the bridge die 212. There may be any suitable number of build-up layer(s) 210 over the power plane build-up layer 204. After fabricating the build-up layer(s) 210, a cavity overlying the power plane contact 206 in the power plane build-up layer 204 may be formed within the build-up layers 210 to accommodate the bridge die 212. In example embodiments, the bridge die 212 with through contacts may be disposed within the cavity and over at least a portion of the power plane contact 206. A layer of conductive adhesive 208 may be provided between the power plane contact 206 and the backside of the bulk 214 of the bridge die 212.

It will be appreciated that in example embodiments of the disclosure, the thickness of the bridge die 212 may be such that it is approximately the thickness of an integer number of build-up layers. This may be so that subsequent to embedding the bridge die 212 in the cavity formed in build-up layers 210, the processing surface remains relatively planar. The planarity of the surface at these intermittent fabrication points may provide a relatively more robust fabrication process and resulting semiconductor package 200. For example, providing a relatively flat intermittent surface may result in relatively improved adhesion of subsequent layers that may overlie the bridge die 212 and the build-up layer 210 surface.

One or more overlying build-up layer(s) 220 may be formed on top of the bridge die 212. The overlying build-up layer 220 may have metal contacts 222, 224 that may line up and contact metal traces and/or vias 218 formed in one or more back-end-of-line (BEOL) interconnect layers 216 of the bridge die 212. If the overlying build-up layer 220 is also the topmost build-up layer, as depicted here, then the dies 226, 228 may be assembled thereon. In other example embodiments, the build-up layer 220 overlying the bridge die 212 may not be the topmost build-up layer. In these cases, there may be one or more build-up layers over the build-up layer overlying and contacting the bridge die 212, and the dies 226, 228 may be assembled on those one or more build-up layers.

The dies 226, 228 may be assembled on the semiconductor package 200 with through bridge die connections, in example embodiments, using die-to-package connections 230, 232, 234, 236 of various types and/or dimensions. In some example embodiments, the die-to-package connections 230, 234 that may be overlying or in relative proximity to the bridge die 212 may be of tighter (e.g., smaller size, reduced pitch, and/or higher spatial density, etc.) than the die-to-package connections 232, 236 that may not be overlying the bridge die 212 and/or not in relative proximity of the bridge die 212. In some example embodiments, the die-to-package connections 230, 232, 234, 236 may be connected to one or more power delivery metal contacts 224 of the build-up layer 220, that may be connected to power delivery metal traces and/or vias 218 of the interconnect layer(s) 216 of the bridge die 212, that may in turn be connected to the bulk 214 of the bridge die 212, that further in turn may be connected to the power plane contact 206 of the build-up layer 204. Thus, by the aforementioned pathway, power may be delivered to one or more of the dies 226, 228 through the bulk 214 of the bridge die 212, according to example embodiments of the disclosure.

The first die 226 and the second die 228 may be electrically and mechanically attached to the package build-up layer 220 by any suitable mechanism including, but not limited to, metal pillars (e.g., copper pillars), flip chip bumps, solder bumps, any type of low-lead or lead-free solder bumps, tin-copper bumps, wire bonds, wedge bonds, C4, ACF, NCF, combinations thereof, or the like. Pick-and-place tools and processes may be used, for example, to align and attach dies 226, 228 onto the package. In example embodiments, copper pillars may be used for die attachment. The copper pillars may be of any suitable size. For example, the copper pillars may be approximately in the range of about 10 μm to about 150 μm in width. The dies 226, 228 may be aligned and attached to the semiconductor substrate by any suitable mechanisms. For example, a thermosonic process may be used to fuse the copper pillars to corresponding pads on the package substrate using gold/nickel, tin/lead, or any suitable metallurgy. As another example embodiment, a wave soldering process may be used to attach the dies 226, 228 to the package build-up layer 220.

In example embodiments, underfill material 238, 240 may be provided around the die-to-package contacts 230, 232, 234, 236, between the dies 226, 228 and the build-up layer 220. Representative epoxy materials in the underfill material 238, 240 may include an amine epoxy, imidizole epoxy, a phenolic epoxy or an anhydride epoxy. Other examples of underfill material include polyimide, benzocyclobutene (BCB), a bismaleimide type underfill, a polybenzoxazine (PBO) underfill, or a polynorbornene underfill. Additionally, the underfill material 238, 240 may include a filler material, such as silica. Underfill material 238, 240 may be introduced by spin coating, extrusion coating or spray coating techniques. In another embodiment, the underfill material 238, 240 includes a standard fabrication passivation material such as an inorganic passivation material (e.g., silicon nitride, silicon oxynitride) or organic passivation material (e.g., polyimide).

Molding 242 may be disposed on the top surface of the build-up layer 220 and encapsulating the dies 226, 228. The molding material may be any suitable molding material. For example, the molding material may be a liquid dispensed thermosetting epoxy resin molding compound. The molding compound may be deposited on the surface of the build-up layer 220 using any suitable mechanism including, but not limited to, liquid dispense, spin coating, spray coating, squeegee, screen printing, combinations thereof, or the like.

The mold compound, after being dispensed onto the top surface of the build-up layer 220, may be cured while pressure is applied thereon by a chase surface. In example embodiments, the chase (e.g., a relatively flat surface pressed on top of the liquid molding material disposed on top of the build-up layer 220) may itself be heated. Upon curing (e.g., cross-linking), the deposited molding compound may harden and form molding 242 to adhere to the build-up layer 220 and encapsulating the dies 226, 228. In example embodiments, the molding 242 may have fillers and/or other materials therein to preferentially control the coefficient of thermal expansion (CTE), reduce stresses, impart flame retardant properties, promote adhesion, and/or reduce moisture uptake in the molding 242. The molding 242, in example embodiments, may be any suitable thickness.

As disclosed above, the semiconductor package 200 with through bridge die connections may have through-hole vias 244 formed in the core 202. These through-hole vias 244 may provide electrical connectivity of the dies 226, 228 to one or more bottom build-up layer(s) 246. Like topside build-up layers 204, 210, the bottom build-up layer(s) 246 may also include dielectric material 248, such as dielectric laminate material, and metal contacts 250. Although a single build-up layer is shown on the bottom side of the semiconductor package 200, it will be appreciated that there may be any suitable number of build-up layers on the bottom side of the semiconductor package 200. It will be appreciated that in some example processing schemes, there may be a plurality of build-up layers on the bottom side of the semiconductor package 200. In fact, in some example embodiments, there may be an equal number of build-up layers on the bottom side as there are on the top side of the semiconductor package 200. In some cases, the processes for forming build-up layers may be amenable to forming build-up layers on both sides of the core 202 nearly simultaneously and in a relatively cost-effective manner. For example, dielectric material for a build-up layer may be laminated on both sides of the core 202 concurrently.

In example embodiments, contacts 252 for package level I/O may be provided on the bottom side build-up layer(s) 246. The contacts 252 may be any suitable contacts for semiconductor package-to-board interconnections, such as ball grid array (BGA) or other area array contacts.

Figure 3B:
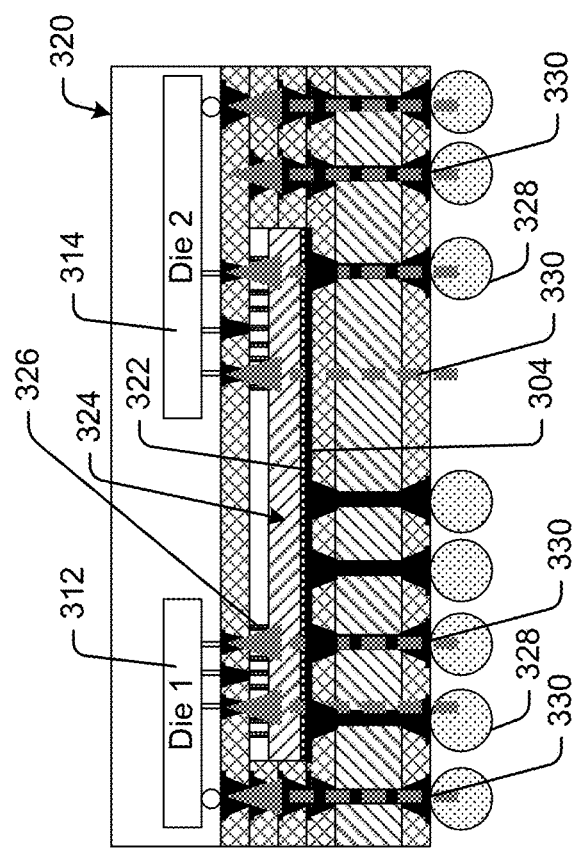
FIGS. 3A and 3B depict simplified cross-sectional schematic diagrams illustrating power delivery pathways in a multi-die semiconductor package without and with through die connections, in accordance with example embodiments of the disclosure.
Figure 3A:
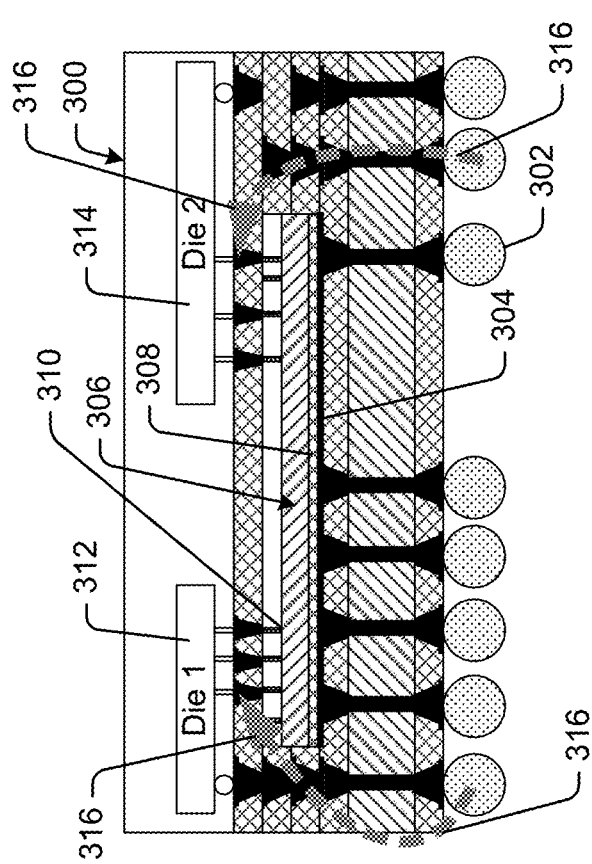

FIGS. 3A and 3B depict simplified cross-sectional schematic diagrams illustrating power delivery pathways 316, 330 in a multi-die semiconductor package without through die connections 300 and a multi-die semiconductor package with through die connections 320, in accordance with example embodiments of the disclosure.

FIG. 3A depicts a simplified cross-sectional schematic diagram illustrating a semiconductor package 300 with a bridge die 306 embedded therein, wherein the bridge die 306 does not provide through bridge die connections. In other words, the bridge die 306 in FIG. 3A cannot be used to provide a power or ground connection from power contacts 302 and/or a power plane trace/contact 304 to the dies 312, 314 via contacts 310. Adhesive 308 may not be a conductive material and/or bridge die 306 may not provide a relatively electrically conductive path from the bottom to the top of the bridge die 306. Additionally, the bridge die 306 may be fabricated in a manner such that the contacts 310 may not be electrically connected to the bulk of the bridge die 306. In this case, the pathway for providing power to various regions of the dies 312, 314 may be a curved pathway 316, where the power current flow may be around the embedded bridge die 306. It will be appreciated that such a circuitous pathway 316 for providing power to the dies 312, 314 may result in degradation in the quality of the power delivered. For example, an indirect route for power delivery may result in relatively greater voltage drops caused by larger resistance and inductance, relatively greater noise (shot noise, electromagnetic interference noise, cross-talk noise, etc.), relatively greater power delivery induced timing jitter, and/or relatively greater skew across spatially distributed power delivery points. In embodiments where the bridge die 306 is used for ground plane connections, similar types of infirmities may result from a relatively circuitous pathway 316.

FIG. 3B depicts a simplified cross-sectional schematic diagram illustrating a semiconductor package 320 with a bridge die 324 embedded therein, wherein the bridge die 324 is configured for through bridge die connections, in accordance with example embodiments of the disclosure. In other words, the bridge die 324 may be used to provide power or ground, connections from power contacts 328 and/or a power plane trace/contact 304 to the dies 312, 314 via contacts 326. Adhesive 322 may be a conductive adhesive and the bridge die 324 may provide a relatively conductive electrical path from the bottom to the top of the bridge die 324. In this case, the bridge die 324 may be fabricated in a manner such that contacts 326 may be electrically connected to the bulk of the bridge die 324. In this case, the pathway for providing power to various regions of the dies 312, 314 may be a relatively direct, vertical pathway 330, where at least a portion of the power current flow may be through the embedded bridge die 324. It will be appreciated that such a direct pathway 330 for providing power to the dies 312, 314 may result in relative improvements in the quality of the power delivered when compared to the circuitous pathway 316 of FIG. 3A. For example, a direct route for power delivery may result in relatively reduced voltage drops due to lower resistance and inductance, relatively lower noise (shot noise, electromagnetic interference noise, cross-talk noise, etc.), relatively reduced power delivery induced timing jitter, and/or relatively reduced skew across spatially distributed power delivery points. In embodiments where the bridge die 324 is used for ground plane connections, similar types of improvements may be realized from a relatively direct pathway 330.

Figure 4:
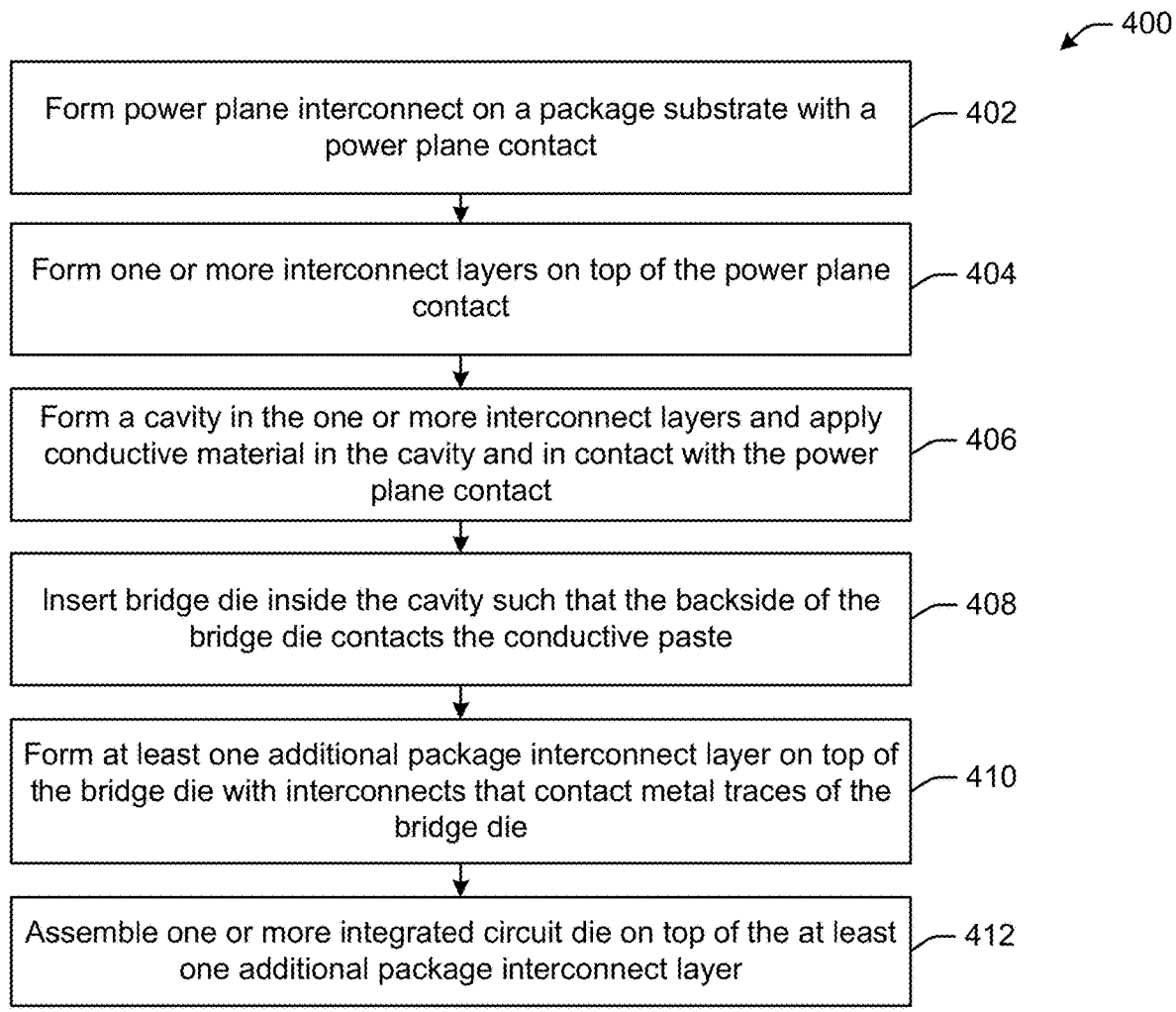
FIG. 4 depicts a flow diagram illustrating an example method for fabricating semiconductor packages with the through bridge die connections of FIGS. 1-3, in accordance with example embodiments of the disclosure.

FIG. 4 depicts a flow diagram illustrating an example method for fabricating semiconductor packages with the through bridge die connections of FIGS. 1-3, in accordance with example embodiments of the disclosure.

At block 402, a power plane interconnect may be formed on a package substrate. It will be appreciated that at this point, the package substrate may be in panel form and may be processed with a plurality of other semiconductor packages being fabricated on the same package substrate panel. At a later point, the package substrate may be singulated (e.g., by laser ablation, saw, etc.) to form individual package substrates. The power plane interconnect may be a build-up layer with build-up dielectric and metal traces and/or pads disposed therein. The power plane interconnect may have a power plane contact disposed on the surface thereof. In some example embodiments, the power plane interconnect may directly overlie the core of the semiconductor package and, in other cases, the power plane interconnect may overlie other build-up layer(s) that are disposed on the top of the core. In some alternate example embodiments, it will be appreciated that there may not be a core in the fabrication of the semiconductor package. In these coreless designs, there may still be a power plane that may be formed, such as by build-up on other build-up layers (e.g., underlying build-up layers).

At block 404, one or more interconnect layers may be formed on top of the power plane. Like the power plane interconnect, the one or more interconnect layers may be build-up layers with metal traces and/or pads of a build-up dielectric material. In example embodiments, the build-up layers may not have any traces and/or pads overlying the power plane contact in the power plane layer. In other words, there may be an exclusion zone for metal features in the build-up layers where the cavity for the bridge die is to be formed.

At block 406, a cavity may be formed in the one or more interconnect layers and conductive material may be applied within the cavity and in contact with the power plane contact. The cavity may be formed by any suitable mechanism including, but not limited to, patterned wet etch, patterned dry etch, laser ablation, wet clean, combinations thereof, or the like. In some cases, the metal contact may be surface treated prior to forming the build-up layers at block 404, such that the dielectric material of the overlying build-up layers releases relatively cleanly from the surface of the power plane contact. After the power plane contact is exposed at the bottom of the cavity, the conductive adhesive may be disposed thereon.

At block 408, the bridge die may be inserted in the cavity such that the backside of the bridge die contacts the conductive paste. In example embodiments, the bridge die may be aligned over the cavity and inserted into the cavity. In example embodiments, this process may be performed by the use of pick-and-place tools for alignment and placement of the bridge die within the cavity. The bridge die, in example embodiments, may have a height such that after insertion in the cavity, the top surface (e.g., the top surface of the bridge die and the top surface of the top-most build-up layer fabricated thus far) of the semiconductor package as formed thus far is relatively planar. The bottom of the bridge die may be positioned so that ohmic contact with the power plane contact is achieved. The top surface of the bridge die may be positioned relative to the rest of the semiconductor package such that contact may be made to one or more electrical pads on the surface of the bridge die.

At block 410, at least one additional package interconnect layer may be formed on top of the bridge die, where the at least one additional package interconnect layer may have interconnects that contact metal traces of the bridge die. The at least one additional package interconnect layer, in the form of one or more build-up layers, may be formed in a manner to make electrical contact to one or more pads on the surface of the bridge die. In example embodiments, the build-up layer formed immediately on top of the bridge die may have electrical contacts to the underlying bridge die and/or other build-up layers surrounding the bridge die.

At block 412, one or more integrated circuit dies may be assembled on top of the at least one additional package interconnect layer. The dies may be any suitable electronic device, such as a semiconductor-based electronic device. In example embodiments, the die may be an integrated circuit (IC) with at least one active device (e.g., transistor, diodes, etc.) and/or passive device (e.g., resistors, inductors, capacitors, etc.).

It should be noted, that the method 400 may be modified in various ways in accordance with certain embodiments of the disclosure. For example, one or more operations of the method 400 may be eliminated or executed out of order in other embodiments of the disclosure. Additionally, other operations may be added to the method 400 in accordance with other embodiments of the disclosure.

FIGS. 5A-5F depict simplified cross-sectional schematic diagrams of an example bridge die having through die connections and a fabrication process therefor, in accordance with example embodiments of the disclosure. Although FIGS. 5A-5F depict a particular process flow and resulting bridge die, it will be appreciated that variations of the processes and structures are contemplated and encompassed by the disclosure as provided herein. For example, it will be appreciated that some processes may be performed in an order different from that depicted herein. As a further example, it will be appreciated that some processes may have suitable substitutes that may be implemented without deviating from embodiments of the disclosure. It will further be appreciated that while fabrication processes described herein may be processes that are typically performed in a semiconductor fabrication facility/clean room (fab), the processes may be performed in any suitable processing facility using any suitable processing equipment.

Figure 5A:
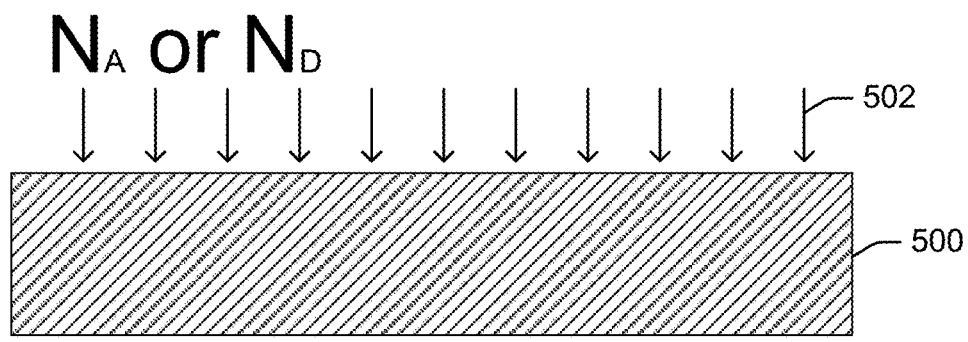
FIGS. 5A-5F depict simplified cross-sectional schematic diagrams of an example bridge die having through die connections and a fabrication process therefor, in accordance with example embodiments of the disclosure.

FIG. 5A depicts a simplified cross-sectional schematic diagram of a bulk silicon wafer 500 that is doped 502 and on which the bridge die is to be fabricated, in accordance with example embodiments of the disclosure. The wafer 500 may be of any suitable size, thickness, crystal type, grade, and flat/notch/laser scribe orientation. In example embodiments, the wafer 500 may be any one of 300 mm (12 inch), 200 mm (8 inch), 150 mm (6 inch), 100 mm (4 inch), 50 mm (2 inch) size wafers, and/or any other suitable size. In example embodiments, the wafer 500 may have a thickness in approximately a range of about 400 µm to about 1.5 mm. In some example embodiments, the thickness of the wafer 500 may be approximately in the range of about 720 µm to about 775 µm. In some other example embodiments, the thickness of the wafer 500 may be approximately in the range of about 950 µm to about 1.1 mm. In example embodiments, the wafer crystal orientation of the wafer 500 may be any one of <100>, <110>, <111>, or any other suitable crystal orientation. In some example embodiments, a p-type wafer may be used and, in other example embodiments, an n-type wafer may be used. In some example embodiments, the wafer 500 may be a device grade wafer, with or without an ultra-pure epitaxial layer. In other example embodiments, the wafer 500 may be a test grade wafer. In other example embodiments, non-circular silicon substrates may be used. In still further alternative embodiments, non-crystalline silicon wafers, such as poly-silicon wafers, may be used. In yet other example embodiments, semiconductor wafers other than silicon (e.g., germanium wafers) may be used for the following processes.

The wafer 500 may be cleaned prior to doping. The doping process may include any of an ion implant process and/or diffusion process. Dopant material may be introduced by ion implantation. In example embodiments, where ion implantation is used for doping, a relatively thin oxide (e.g., $SiO_2$, tetraethylorthosilicate deposited oxide (TEOS), etc.) layer may be grown and/or deposited prior to the ion implant process. In some example embodiments, the thin oxide layer may be sacrificial and may be stripped prior to subsequent processing. In other example embodiments, the thin oxide layer may remain on the surface and may not interfere with subsequent processing of the wafer 500. The ion implant may be performed with any suitable energy, dose, and/or current. After the ion implant process, a thermal/anneal process may be performed to activate and/or drive the dopant 502 (e.g., diffused dopant material). In example embodiments, donor dopants ($N_D$) (e.g., phosphorous, arsenic, bismuth, antimony, etc.) may be used to form an n-type wafer 500. In other example embodiments, acceptor dopants ($N_A$) (e.g., boron, etc.) may be used to form a p-type wafer 500. In other example embodiments, the doping process may be performed by thermal diffusion, by introducing dopants ($N_D$ or $N_A$) 502 on the surface and/or in gas phase on the surface of the wafer 500. The thermal process, in example embodiments, may drive the dopants 502 into the wafer 500, such as by Fickian diffusion (e.g., corresponding to Fick's Second Law of Diffusion).

In example embodiments, the wafer 500 may be doped, at least relatively proximal to the top surface, to approximately a range of about $10^{18}$ cm$^{-3}$ to about $10^{20}$ cm$^{-3}$. In example embodiments, the donor dopant's 502 doping density may be approximately $10^{20}$ cm$^{-3}$. In example embodiments, the wafer 500 may be doped degenerately. The resistivity after doping of the wafer 500 may be approximately in the range of about $10^{-5}$ Ω·cm to about $10^{-3}$ Ω·cm, in example embodiments.

Figure 5B:
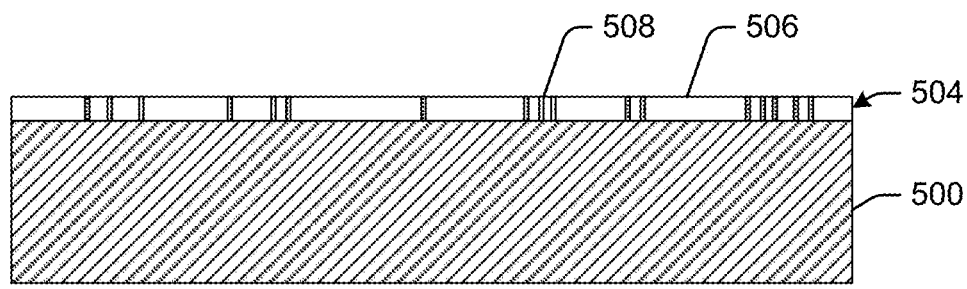

FIG. 5B depicts a simplified cross-sectional schematic diagram of the bulk silicon wafer 500 of FIG. 5A with a contact layer 504 with dielectric 506 and bulk silicon contacts 508, in accordance with example embodiments of the disclosure. The dielectric 506 may be grown and/or deposited. For example, the dielectric may be grown in a dry ($O_2$) thermal process or a wet ($H_2O$) thermal process. The thermal process may consume part of the bulk silicon in forming the dielectric ($SiO_2$) thereon. In other example embodiments, the dielectric 506 may be deposited on the surface of the doped wafer 500, such as by a chemical vapor deposition (CVD), plasma enhanced CVD (PECVD), atmospheric pressure CVD (APCVD), combinations thereof, or the like. The aforementioned processes may use any variety of chemistries and feed gases, such as TEOS, silane/oxygen ($SiH_4/O_2$), trimethylsilane (3MS), dimethylsilane (2MS), dilutant gases (Ar, He, Xe, Ne), combinations thereof, or the like. As discussed above, prior to the ion implant process of FIG. 5A, a thin oxide layer may have been deposited on top of the bulk silicon wafer 500 in some cases. In example embodiments, the thin oxide layer deposited for ion implant purposes may remain on top of the bulk silicon wafer 500, on top of which the remainder of the dielectric 506 may be grown and/or deposited.

After forming (e.g., growing or depositing) the dielectric 506, a series of processes may be performed to form contacts 508 to the bulk silicon wafer 500. These processes may involve a patterning process, such as a photolithography process, where a light-sensitive photoresist may be deposited on top of the dielectric 506 and may be patterned by shining a light of suitable frequency thereon through a mask (e.g., patterned template) and developing the photoresist. Although a photolithographic patterning process is discussed, it will be appreciated that any suitable patterning process (e.g., ebeam, X-ray, template embossing, screen printing, etc.) may be used for the purpose of defining the locations of the bulk contacts 508. After forming a photoresist mask, the contact holes may be etched in the dielectric 506. The etching of the dielectric may entail any suitable mechanism including, but not limited to, wet etching and/or dry etching. In some example embodiments, a plasma etch, such as a magnetically enhanced reactive ion etch (MERIE), may be performed to form the contact holes for the doped bulk wafer 500. In example embodiments, after forming the contact hole, the photoresist may be stripped/ashed. After the contact holes are formed, the contact holes may be filled with metal or any other suitable conductor to form the contacts 508. The contact holes may be filed using any suitable metal deposition process including, but not limited to CVD, physical vapor deposition (PVD), and/or plating. In example embodiments, the contact holes may be filled with tungsten (W) or other refractory metal using a CVD process. In these or other example embodiments, the tungsten may be deposited over the surface of the dielectric 506 while depositing within the contact holes. A chemical mechanical polish (CMP) process may be performed to remove the tungsten from the surface of the dielectric 506. In some alternate embodiments, the contacts 508 may be lined with other refractory metals and/or nitrides thereof (e.g., titanium nitride (TiN), tantalum nitride (TaN), etc.) prior to filling with tungsten.

Figure 5C:
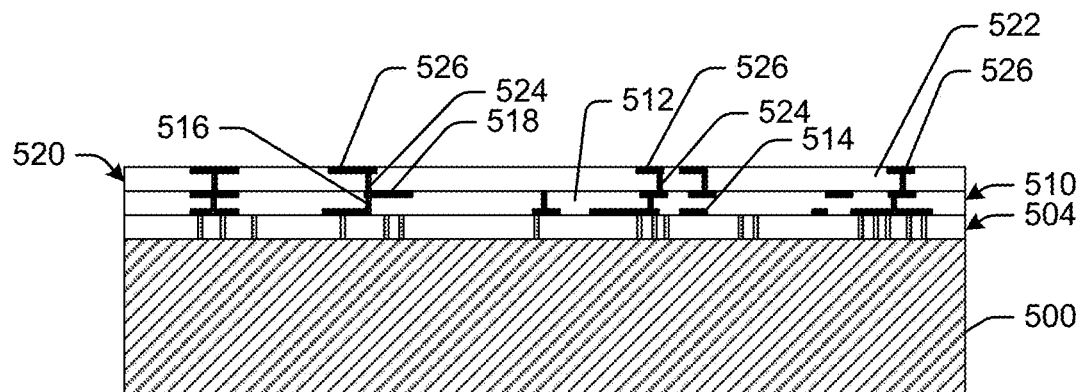

FIG. 5C depicts a simplified cross-sectional schematic diagram of the silicon wafer 500 of FIG. 5B with one or more layers 510, 520 of metal interconnects fabricated thereon, in accordance with example embodiments of the disclosure. The metal interconnect layers may be formed by any suitable process such as patterned metal processes (e.g., aluminum subtractive processes) and/or inlaid processes (e.g., copper damascene, copper dual damascene, etc.). In example embodiments, trenches 514 may be formed within the dielectric 512 in a single-inlaid process on top of the contacts 508 and then the vias 516 and the trenches 518 may be formed in a dual-inlaid fashion, where the metallization of the vias 516 and the trenches 518 may be performed simultaneously or nearly simultaneously. Similarly, the vias 524 and the trenches 526 of the metal layer 520 may be formed within the dielectric 522 in a dual inlaid fashion. Alternatively, the metal interconnect layers 510, 520 may be fabricated in a single inlaid fashion, either via-first or trench-first. In yet other alternative embodiments, the metal interconnect layers 510, 520 may be formed in a subtractive metallization scheme where trenches may be defined by etching blanket deposited metal (e.g., aluminum).

In example embodiments, the processes involved in forming the trenches 518, 526 and the vias 516, 524 in the metal interconnect layers 510, 520 may be any suitable process for depositing dielectric, patterning vias, etching vias, patterning trenches, etching trenches, and metal filling vias and trenches, and polishing back any excess metal. In some example embodiments, a first photolithography process (e.g., spin on resist, expose, develop, etc.) may be performed to define, with the photoresist, the vias 516, 524 of the metal interconnect layers 510, 520. After defining the vias 516, 524, the via holes may be etched, such as by using a MERIE process with any suitable chemistry (e.g., chemistries having $CF_4$, $C_2F_6$, $C_3F_8$, $C_4F_6$, $C_4F_8$, etc.), and the photoresist may be stripped. A second photolithography process may be performed to define the trenches 518, 526 in the metal interconnect layers 510, 520. The trenches 518, 526 may then be etched to a desired depth within the dielectric 512, 522, and then the photoresist may be stripped. After forming the via and trench recession, a metal liner and/or barrier metal layer (e.g., TaN, TiN, etc.) may be deposited in a continuous fashion over the walls of the via holes and trench cavities, as well as the surface of the wafer dielectric 512, 522. The barrier metal layer may be deposited in any suitable mechanism, such as by CVD. After depositing the barrier metal layer, a seed layer of copper may be deposited on top of the barrier metal layer by any suitable mechanism, such as PVD. The seed may be a continuous (e.g., electrically continuous) layer to enable subsequent electroplating. After depositing the Cu seed layer, Cu electroplating may be performed using any suitable process parameters and chemistries, such as a cupric solution having surfactants and inhibitors to enhance bottom up via filling. The Cu electroplating process may fill the vias and trenches, as well as deposit Cu on the surface of the dielectric. After electroplating Cu, a CMP process may be performed to remove the Cu plating, the Cu seed, and the barrier metal from the surface of the dielectric 512, 522.

Figure 5D:
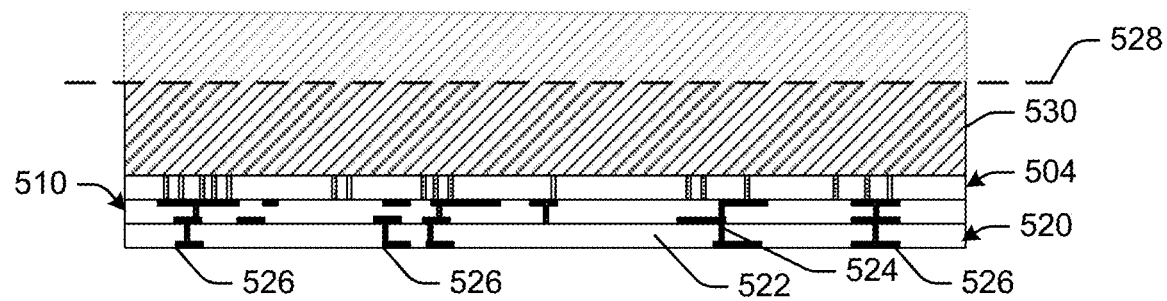

FIG. 5D depicts a simplified cross-sectional schematic diagram of the silicon wafer of FIG. 5C with backside thinning of the bulk silicon wafer 500, in accordance with example embodiments of the disclosure. The thinning process may involve, in example embodiments, a backside grind followed by a backside polish of a predetermined depth 528, followed by a clean process. In example embodiments, the backside thinning may involve first mounting the bridge die wafer on a second substrate, such as a handle wafer or dicing tape. In these embodiments, the front side (e.g., the side on which the interconnect metal layers were fabricated) may be attached (e.g., in a face-down manner) on the second substrate. The grinding and/or polishing process may involve any suitable tribology and/or process parameters, including pads and/or grit and/or slurry of any suitable type and/or size. The wafer 500 may be thinned to a suitable designed bulk wafer 530 thickness to fit into a cavity formed in the semiconductor package within which it is to be disposed. For example, if a build-up layer of the semiconductor package is 30 µm thick, then the bridge die may be thinned to approximately 30 µm thick to fit in a cavity that is one build-up layer thick. As another example, if the build-up layer is still 30 µm thick and the cavity for the bridge die insertion is three build-up layers thick, then the bridge die may be thinned to approximately 90 µm thick to fit in the cavity. In some example embodiments, the bridge die wafer may be thinned to approximately the range of about 25 µm to about 400 µm; in the same or other example embodiments, to approximately the range of about 25 µm to about 60 µm; and yet in further example embodiments, to approximately the range of about 150 µm to about 250 µm.

Figure 5E:
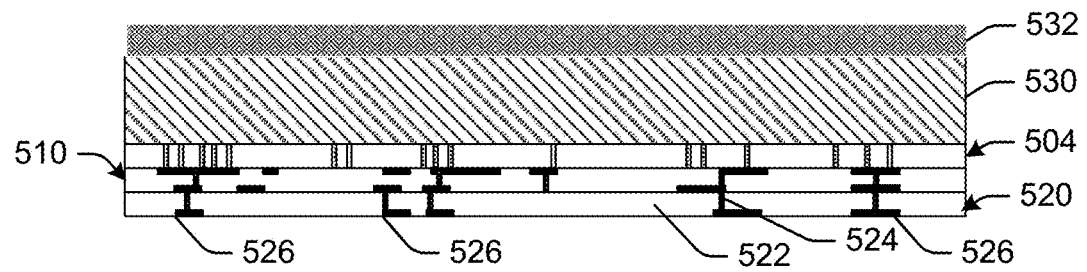

FIG. 5E depicts a simplified cross-sectional schematic diagram of the thinned silicon wafer 530 of FIG. 5D with backside metal 532, in accordance with example embodiments of the disclosure. After thinning, if tape and/or handle substrates were attached for the thinning process, the tape or handle substrates may be removed, or they may remain attached for subsequent processing. The wafer 530 may have an ohmic contact formed on the backside with the backside metal 532. In some example embodiments, optionally, another doping process (diffusion, ion implant, etc.) may be performed on the ground and/or polished backside of the wafer 530 to provide a highly doped surface for relatively good ohmic contact. Next, metal 532 may be deposited on the backside of the wafer 530 using any suitable process, such as CVD, PVD, or the like. In some cases, tungsten may be deposited on the backside. In other cases, Ni/Au contacts may be formed on the backside of the wafer 530. Indeed, any suitable metallurgy may be used for forming the backside metal 532.

Figure 5F:
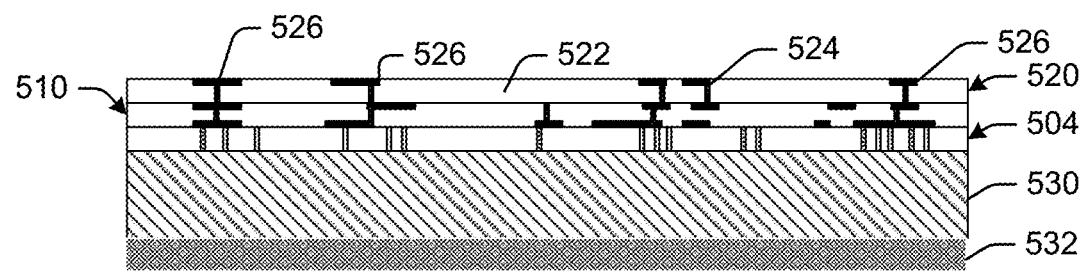

FIG. 5F depicts a simplified cross-sectional schematic diagram of the silicon wafer of FIG. 5E that is singulated and ready for embedding in the semiconductor package of FIG. 1D, in accordance with example embodiments of the disclosure. After forming the backside ohmic contact, the wafer may be cleaned and singulated (e.g., diced). The cleaning process may involve any suitable clean process (e.g., sonic clean (SC1), SC2, piranha clean, etc.). The dicing process may involve attaching the wafer to dicing tape in a face-up configuration (e.g., interconnect metal layers facing up), and performing a saw process, or a laser process, to singulate each of the bridge dies that were formed on the wafer 530 by the processes depicted in FIGS. 5A-5F.

Figure 6:
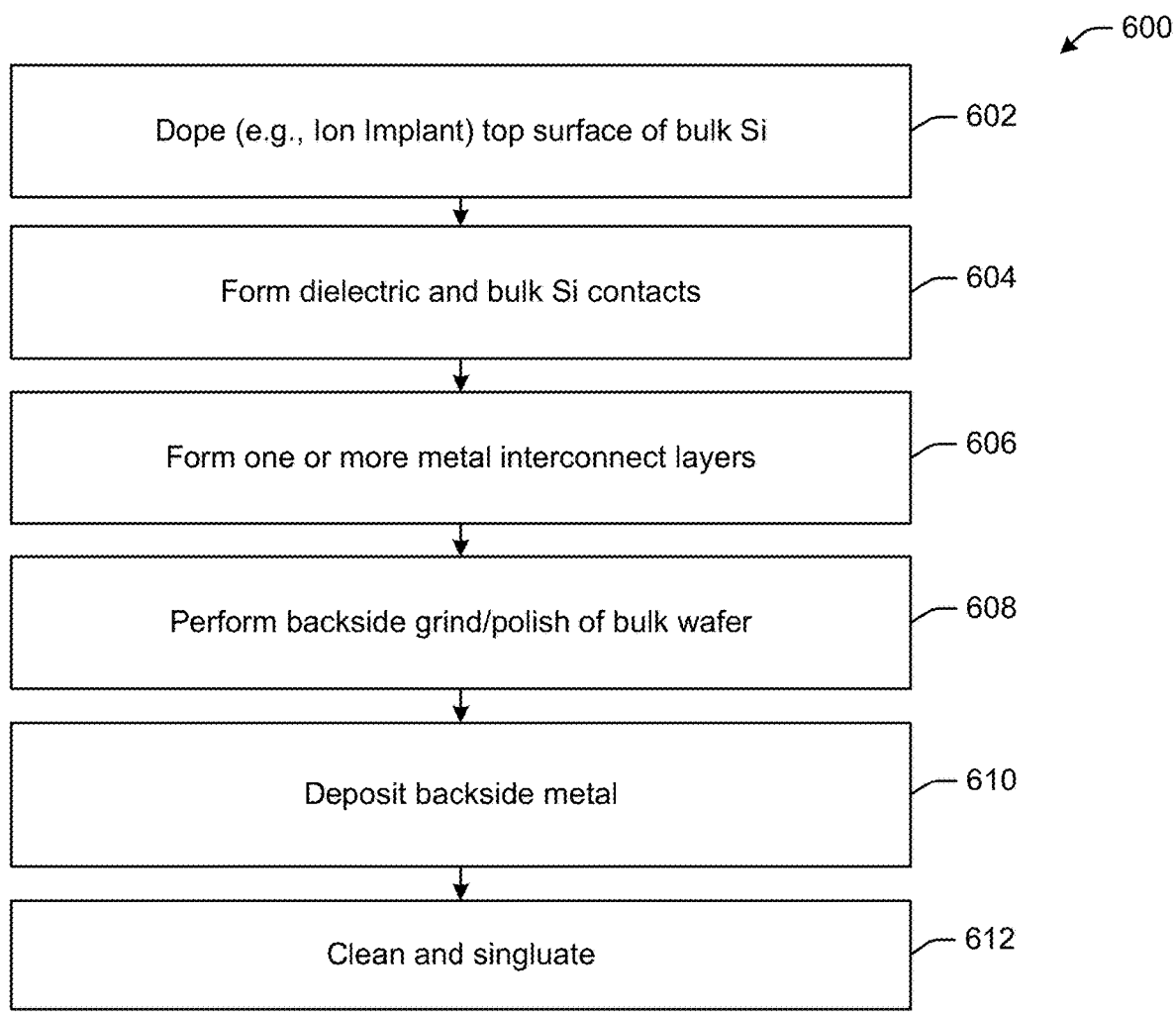
FIG. 6 depicts a flow diagram illustrating an example method for fabricating the bridge die with the through die connections of FIGS. 5A-5F, in accordance with example embodiments of the disclosure.

FIG. 6 depicts a flow diagram illustrating an example method 600 for fabricating the bridge die with the throughdie connections of FIGS. 5A-5F, in accordance with example embodiments of the disclosure.

At block 602, a top surface of bulk silicon may be doped. As discussed above, the doping may be performed by any suitable mechanism including, but not limited to, diffusion, ion implantation, combinations thereof, or the like. At block 604, dielectric and bulk silicon contacts may be formed. The dielectric may be any suitable grown dielectric (e.g., $SiO_2$) and/or deposited dielectric (e.g., TEOS deposited dielectric, 3MS deposited dielectric, 2MS deposited dielectric, low-k dielectric, etc.). Contacts may be formed using any suitable processes, such as patterning, etch, photoresist strip, barrier metal deposition, CMP, etc. At block 606, one or more metal interconnect layers may be formed. The one or more metal interconnect layers may be formed by any suitable process including, but not limited to, via-first-trench-last, trench-first-via-last, single-inlaid, dual-inlaid, Cu interconnects, subtractive metal, Al interconnects, combinations thereof, or the like. It will be appreciated that some of the interconnects fabricated on the bridge wafer may be used for the purposes of routing signals between two or more dies packaged in the semiconductor package with through bridge die connections, as disclosed herein.

At block 608, backside thinning of the bulk wafer may be performed. The thinning process may utilize any suitable sequence of grinding, polishing, and/or cleaning. The thinning process may be monitored in-situ to reach a targeted thickness. In some example embodiments, the targeted thickness may be an integer multiple of the thickness of the build-up layers formed on the surface of the semiconductor package as described herein. At block 610, backside metal may be deposited on the wafer. In some cases, backside doping may be performed prior to depositing the backside metal. For example the backside may be doped degenerately to form a good ohmic contact to the backside metal. The backside metal may be deposited by any suitable mechanism, such as CVD, PVD, and or plating. At block 612, cleaning and singulation may be performed. The singulation may be performed by dicing tape. After dicing, the bridge die may be held on dicing tape in a manner such that the bridge die may be picked up using pick-and-place tools for placement in the cavity formed in the semiconductor packages, as described herein.

It should be noted, that the method 600 may be modified in various ways in accordance with certain embodiments of the disclosure. For example, one or more operations of the method 600 may be eliminated or executed out of order in other embodiments of the disclosure. Additionally, other operations may be added to the method 600 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages through bridge die connections, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages with through bridge die connections, as disclosed herein. The semiconductor packages with through bridge die connections, as disclosed herein, may be provided in any variety of electronic device including consumer, industrial, military, communications, infrastructural, and/or other electronic devices.

The semiconductor package with bridge die connections, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package with through bridge die connections, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAMBUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package with through bridge die connections is provided may be a computing device. Such a computing device may house one or more boards on which the semiconductor package with bridge die connections may be disposed. The board may include a number of components including, but not limited to, a processor and/or at least one communication chip. The processor may be physically and electrically connected to the board through, for example, electrical connections of the semiconductor package with EMI shielding. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package, comprising: a first build-up layer with a top surface and a bottom surface opposing the top surface, the first build-up layer having a power contact on the top surface of the first build-up layer; a second build-up layer overlying the first build-up layer and having a void overlying the power contact; a bridge die disposed within the void of the second build-up layer, the bridge die having a bridge die backside and a bridge die topside, the bridge die topside having a plurality of bridge die topside contacts, the bridge die backside electrically coupled to the power contact; and a third build-up layer disposed overlying the topside of the bridge die and over the second build-up layer, the third build-up layer having an interconnect trace, the interconnect trace electrically coupled to a first bridge die topside contact of the plurality of bridge die topside contacts. In example embodiments, there may be a conductive adhesive disposed between the power contact and the bridge die backside. In further example embodiments, the bridge die backside comprises a bridge die backside metal layer, and wherein the conductive adhesive contacts the bridge die backside metal. In still further example embodiments, the semiconductor package further comprises a die disposed on the third build-up layer and electrically connected to the interconnect trace.

According to example embodiments, the die is a first die, and further comprising a second die disposed on the third build-up layer, wherein the first die is electrically coupled to the second die via the interconnect trace. In further example embodiments, the interconnect trace is a first interconnect trace, wherein the die is electrically connected to the first interconnect trace via a first die-to-package connect, wherein the die is further electrically connected to a second interconnect trace of the third build-up layer via a second die-to-package connect, and wherein the second die-to-package connect has a greater size than the first die-to-package connect. In still further example embodiments, the first bridge die topside contact is electrically coupled to the bridge die backside by a bridge die via a bridge die bulk. In yet further example embodiments, the void is a first void, and further comprising a fourth build-up layer disposed over the second build-up layer and under the third build-up layer, the fourth build-up layer having a second void overlying the power contact, and wherein the first void and the second void define a cavity in which the bridge die is disposed. In some example embodiments, the bridge die comprises a bulk portion electrically coupled to a backside metal provided on the bridge die backside, and wherein at least one of the plurality of bridge die topside contacts is electrically coupled to the bulk portion to conduct power through the bulk portion of the bridge die to the at least one of the plurality of bridge die topside contacts and to one or more dies electrically connected to the at least one of the plurality of bridge die topside contacts. In example embodiments, the semiconductor package may further comprise a fourth build-up layer. Further still, the semiconductor package may include a package core, the package core having a top package core surface and a bottom package core surface; a fourth build-up layer formed on the bottom package core surface; and one or more package-to-board contacts electrically coupled to the fourth build-up layer.

According to example embodiments, there may be a method, comprising: forming a first build-up layer, the first build-up layer having a power contact; forming one or more second build-up layers overlying the first build-up layer; removing portions of the one or more second build-up layers to form a cavity in the one or more second build-up layers; providing a bridge die within the cavity, wherein a backside of the bridge die is electrically connected to the power contact; forming one or more third build-up layers overlying the bridge die and the one or more second build-up layers; and attaching a first die and a second die to interconnects provided on the one or more third build-up layers. In example embodiments, the method may comprise cutting through the first build-up layer, the one or more second build-up layers, and the one or more third build-up layers to singulate a semiconductor package having the bridge die. In further example embodiments, forming the first build-up layer comprises forming the first build-up layer on a topside of a package core. In yet further example embodiments, the method comprises forming one or more fourth build-up layers on the bottom side of the package core; and forming one or more package-to-board connections on the one or more fourth build-up layers. In still further example embodiments, removing the portions of the one or more second build-up layers further comprises laser ablating the portions of the one or more second build-up layers to expose the power contact underlying the one or more second build-up layers.

According to some example embodiments of the disclosure, the method includes depositing a conductive adhesive within the cavity. In example embodiments, providing the bridge die within the cavity further comprises aligning the bridge die over the cavity and then placing the bridge die within the cavity, wherein a volume of the cavity is greater than a volume of the bridge die. In further example embodiments, providing the bridge die within the cavity further comprises: doping a wafer; forming one or more bulk contacts on a topside of the wafer; forming one or more metal interconnect layers over the one or more bulk contacts; thinning the wafer on a bottom side of the wafer; depositing backside metal on the bottom side of the wafer; and singulating the wafer to form the bridge die. In still further example embodiments, thinning the wafer comprises thinning the wafer to a thickness that is substantially equal to the thickness of the one or more second build-up layers. In yet further example embodiments, attaching a first die comprises: connecting a first contact of the first die to a first pad on the one or more third build-up layers; and connecting a second contact of the first die to a second pad on the one or more third build-up layers, wherein the first pad has a smaller area than the second pad, and wherein the first pad overlies the bridge die and the second pad does not overlie the bridge die.

The claimed invention is:
1. A semiconductor package, comprising:
 a first build-up layer with a top surface and a bottom surface opposing the top surface, the first build-up layer having a power contact on the top surface of the first build-up layer;
 a second build-up layer overlying the first build-up layer, the second build-up layer defining a void overlying the power contact;
 a bridge die disposed within the void of the second build-up layer, the bridge die having a bridge die backside and a bridge die topside, the bridge die topside having a plurality of bridge die topside contacts, the bridge die backside electrically coupled to the power contact; and
 a third build-up layer disposed overlying the topside of the bridge die and over the second build-up layer, the third build-up layer having an interconnect trace, the interconnect trace electrically coupled to a first bridge die topside contact of the plurality of bridge die topside contacts.

2. The semiconductor package of claim 1, further comprising a conductive adhesive disposed between the power contact and the bridge die backside.

3. The semiconductor package of claim 2, wherein the bridge die backside comprises a bridge die backside metal layer, and wherein the conductive adhesive contacts the bridge die backside metal.

4. The semiconductor package of claim 1, further comprising a die disposed on the third build-up layer and electrically connected to the interconnect trace.

5. The semiconductor package of claim 4, wherein the die is a first die, and further comprising a second die disposed on the third build-up layer, wherein the first die is electrically coupled to the second die via the interconnect trace.

6. The semiconductor package of claim 4, wherein the interconnect trace is a first interconnect trace, wherein the die is electrically connected to the first interconnect trace via a first die-to-package connect, wherein the die is further electrically connected to a second interconnect trace of the third build-up layer via a second die-to-package connect, and wherein the second die-to-package connect has a greater size than the first die-to-package connect.

7. The semiconductor package of claim 1, wherein the first bridge die topside contact is electrically coupled to the bridge die backside by a bridge die via a bridge die bulk.

8. The semiconductor package of claim 1, wherein the void is a first void, and further comprising a fourth build-up layer disposed over the second build-up layer and under the third build-up layer, the fourth build-up layer having a second void overlying the power contact, and wherein the first void and the second void define a cavity in which the bridge die is disposed.

9. The semiconductor package of claim 1, wherein the bridge die comprises a bulk portion electrically coupled to a backside metal provided on the bridge die backside, and wherein at least one of the plurality of bridge die topside contacts is electrically coupled to the bulk portion to conduct power through the bulk portion of the bridge die to the at least one of the plurality of bridge die topside contacts and to one or more dies electrically connected to the at least one of the plurality of bridge die topside contacts.

10. The semiconductor package of claim 1, further comprising a fourth build-up layer.

11. The semiconductor package of claim 1, further comprising:
a package core, the package core having a top package core surface and a bottom package core surface;
a fourth build-up layer formed on the bottom package core surface; and one or more package-to-board contacts electrically coupled to the fourth build-up layer.

12. A method, comprising:
forming a first build-up layer, the first build-up layer having a power contact;
forming one or more second build-up layers overlying the first build-up layer;
removing portions of the one or more second build-up layers to form a cavity in the one or more second build-up layers;
providing a bridge die within the cavity, wherein a backside of the bridge die is electrically connected to the power contact, the bridge die having a bridge die topside contact;
forming one or more third build-up layers overlying the bridge die and the one or more second build-up layers, a first of the one or more third build-up layers having an interconnect electrically coupled to the bridge die topside contact; and
attaching a first die and a second die to interconnects provided on the one or more third build-up layers.

13. The method of claim 12, further comprising cutting through the first build-up layer, the one or more second build-up layers, and the one or more third build-up layers to singulate a semiconductor package having the bridge die.

14. The method of claim 12, wherein forming the first build-up layer comprises forming the first build-up layer on a topside of a package core.

15. The method of claim 14, further comprising:
forming one or more fourth build-up layers on the bottom side of the package core; and
forming one or more package-to-board connections on the one or more fourth build-up layers.

16. The method of claim 12, wherein removing the portions of the one or more second build-up layers further comprises laser ablating the portions of the one or more second build-up layers to expose the power contact underlying the one or more second build-up layers.

17. The method of claim 12, further comprising depositing a conductive adhesive within the cavity.

18. The method of claim 12, wherein providing the bridge die within the cavity further comprises aligning the bridge die over the cavity and then placing the bridge die within the cavity, wherein a volume of the cavity is greater than a volume of the bridge die.

19. The method of claim 12, wherein providing the bridge die within the cavity further comprises:
doping a wafer;
forming one or more bulk contacts on a topside of the wafer;
forming one or more metal interconnect layers over the one or more bulk contacts;
thinning the wafer on a bottom side of the wafer;
depositing backside metal on the bottom side of the wafer; and
singulating the wafer to form the bridge die.

20. The method of claim 19, wherein thinning the wafer comprises thinning the wafer to a thickness that is substantially equal to the thickness of the one or more second build-up layers.

21. The method of claim 12, wherein attaching a first die comprises:
connecting a first contact of the first die to a first pad on the one or more third build-up layers; and
connecting a second contact of the first die to a second pad on the one or more third build-up layers, wherein the first pad has a smaller area than the second pad, and wherein the first pad overlies the bridge die and the second pad does not overlie the bridge die.

22. A method, comprising:
forming a first build-up layer, the first build-up layer having a power contact;
forming one or more second build-up layers overlying the first build-up layer;
removing portions of the one or more second build-up layers to form a cavity in the one or more second build-up layers;
providing a bridge die within the cavity, wherein a backside of the bridge die is electrically connected to the power contact;
forming one or more third build-up layers overlying the bridge die and the one or more second build-up layers;
attaching a first die and a second die to interconnects provided on the one or more third build-up layers; and
cutting through the first build-up layer, the one or more second build-up layers, and the one or more third build-up layers to singulate a semiconductor package having the bridge die.

\* \* \* \* \*